(12) United States Patent
Chu

(10) Patent No.: US 6,515,466 B2
(45) Date of Patent: Feb. 4, 2003

(54) PHASE COMPARATOR

(75) Inventor: Meng-Huang Chu, Taipei (TW)

(73) Assignee: Via Technologies, Inc., Taipei Hsien (TW)

( * ) Notice: Subject to any disclaimer, the term of this patent is extended or adjusted under 35 U.S.C. 154(b) by 93 days.

(21) Appl. No.: 09/734,286

(22) Filed: Dec. 11, 2000

(65) Prior Publication Data

US 2001/0010461 A1 Aug. 2, 2001

(30) Foreign Application Priority Data

Jan. 28, 2000 (TW) ................................. 89101460 A

(51) Int. Cl.$^7$ ............... G01R 23/12; G01R 23/175; G06F 19/00; G08C 19/00
(52) U.S. Cl. ............... 324/76.52; 324/76.54; 702/72; 340/825.58
(58) Field of Search .............. 324/76.52, 76.54, 324/86; 702/72, 77; 3410/825.58

(56) References Cited

U.S. PATENT DOCUMENTS

| | | | | |
|---|---|---|---|---|
| 4,216,463 A | * | 8/1980 | Backof et al. | 324/76.48 |
| 4,859,934 A | * | 8/1989 | Gale et al. | 324/76.14 |
| 5,844,408 A | * | 12/1998 | Yoshimura et al. | 324/76.52 |
| 5,854,995 A | * | 12/1998 | Plis et al. | 324/86 |

* cited by examiner

*Primary Examiner*—N. Le
*Assistant Examiner*—Anjan K. Deb
(74) *Attorney, Agent, or Firm*—J. C. Patents

(57) ABSTRACT

A phase comparator for calculating the phase difference between a test wave form and an output wave form in a disk drive includes a phase converter, a first multiplier, a first integrator, a second multiplier, a second integrator and a phase angle calculator. The phase converter for delaying the test wave form for a specific time based on the frequency thereof. The first multiplier electrically coupled to the phase converter for performing a first operation by multiplying the delayed test wave form with the output wave form. The first integrator electrically coupled to the first multiplier for integrating the result of the first operation for a period to generate a first weighted value. The second multiplier for performing a second operation by multiplying the test wave form with the output wave form. The second integrator electrically coupled to the second multiplier for integrating the result of the second operation for the same period to generate a second weighted value. The phase angle calculator electrically coupled to the first integrator and the second integrator for receiving the first weighted value and the second weighted value and then outputting a value representing the phase difference between the test wave function and the output wave form.

13 Claims, 2 Drawing Sheets

PHASE COMPARATOR

CROSS-REFERENCE TO RELATED APPLICATION

This application claims the priority benefit of Taiwan application serial no. 89101460, filed Jan. 28, 2000.

BACKGROUND OF THE INVENTION

1. Field of the Invention

The invention relates to a phase comparator and a method for phase difference comparison using the same, and more particularly to a comparator and a method for calculating the phase difference between an output wave form and an input wave form using an orthogonal characteristic.

2. Description of the Related Art

Typically, disk drives, such as soft disk drives, hard disk drives and compact disk (CD) drives, each use different devices having different parameters in its own compensator system, resulting in a drift on an output result. In order to make each manufactured disk drive have a consistent system bandwidth, the operation of an open loop gain adjustment must be performed in the compensator system thereof.

Furthermore, to resolve the above problem, a test wave form must be inputted to the circuit system of each disk drive to generate an output wave form. Next, a phase comparator receives the test wave form and the output wave form to calculate the phase difference therebetween. Thereafter, the compensator performs a gain adjustment according to the phase difference thereby to keep the system bandwidth consistent.

Referring to FIG. 1, a device for a phase difference calculation according to the prior art is shown. First, a test wave form, generally a sine wave form, is inputted to a circuit system 10 of a CD driver (not shown) to generate a corresponding signal. According to the corresponding signal, a band pass filter 20 outputs an output wave form. The central frequency of the band pass filter 20 is the same as the frequency of the test wave form. Then, a phase comparator 30 receives the test wave form and the output wave form to generate a resultant signal back to the circuit system 10 for performing an open loop gain adjustment. As a result, each disk drive can be well controlled to have a consistent phase difference.

Referring now to FIG. 2, the phase difference between the test wave form and the output wave form is shown. In the prior art, a sampling signal is used to sample two zero cross points of the test wave form and the output wave form thereby to obtain a time difference between the two zero cross points as shown in FIG. 2.

However, it is inevitable that the output wave form after being inputted to the circuit system 10 will bring a plenty of noise signals. Assume that the noise signals are generated around the two zero cross points, and therefore, the phase comparator 30 can not accurately calculate the phase difference of the two signals, or the phase difference will be erroneously calculated.

SUMMARY OF THE INVENTION

In view of the above, the invention relates to a comparator and a method for calculating the phase difference between an output wave form and a test wave form using an orthogonal characteristic.

A phase comparator for calculating the phase difference between a test wave form and an output wave form in a disk drive according to the invention includes a phase converter, a first multiplier, a first integrator, a second multiplier, a second integrator and a phase angle calculator. The phase converter for delaying the test wave form for a specific time based on the frequency thereof. The first multiplier electrically coupled to the phase converter for performing a first operation by multiplying the delayed test wave form with the output wave form. The first integrator electrically coupled to the first multiplier for integrating the result of the first operation for a period to generate a first weighted value. The second multiplier for performing a second operation by multiplying the test wave form with the output wave form. The second integrator electrically coupled to the second multiplier for integrating the result of the second operation for the same period to generate a second weighted value. The phase angle calculator electrically coupled to the first integrator and the second integrator for receiving the first weighted value and the second weighted value and then outputting a value representing the phase difference between the test wave form and the output wave form.

A method for calculating the phase difference between a test wave form and an output wave form according to the invention includes the following steps. The test wave form is delayed for a specific time. A first operation is performed by multiplying the output wave form with the delayed test wave form. The result of the first operation is integrated for a period to generate a first weighted value. A second operation is performed by multiplying the output wave form with the test wave form. The result of the second operation is integrated for the same period to generate a second weighted value. A value of $\tan^{-1}$ (the first weighted value/the second weighted value) is calculated.

BRIEF DESCRIPTION OF THE DRAWINGS

The invention will become more fully understood from the detailed description given hereinafter and the accompanying drawings which are given by way of illustration only, and thus do not limit the present invention, and wherein.

DETAILED DESCRIPTION OF THE PREFERRED EMBODIMENT

Figure 3:
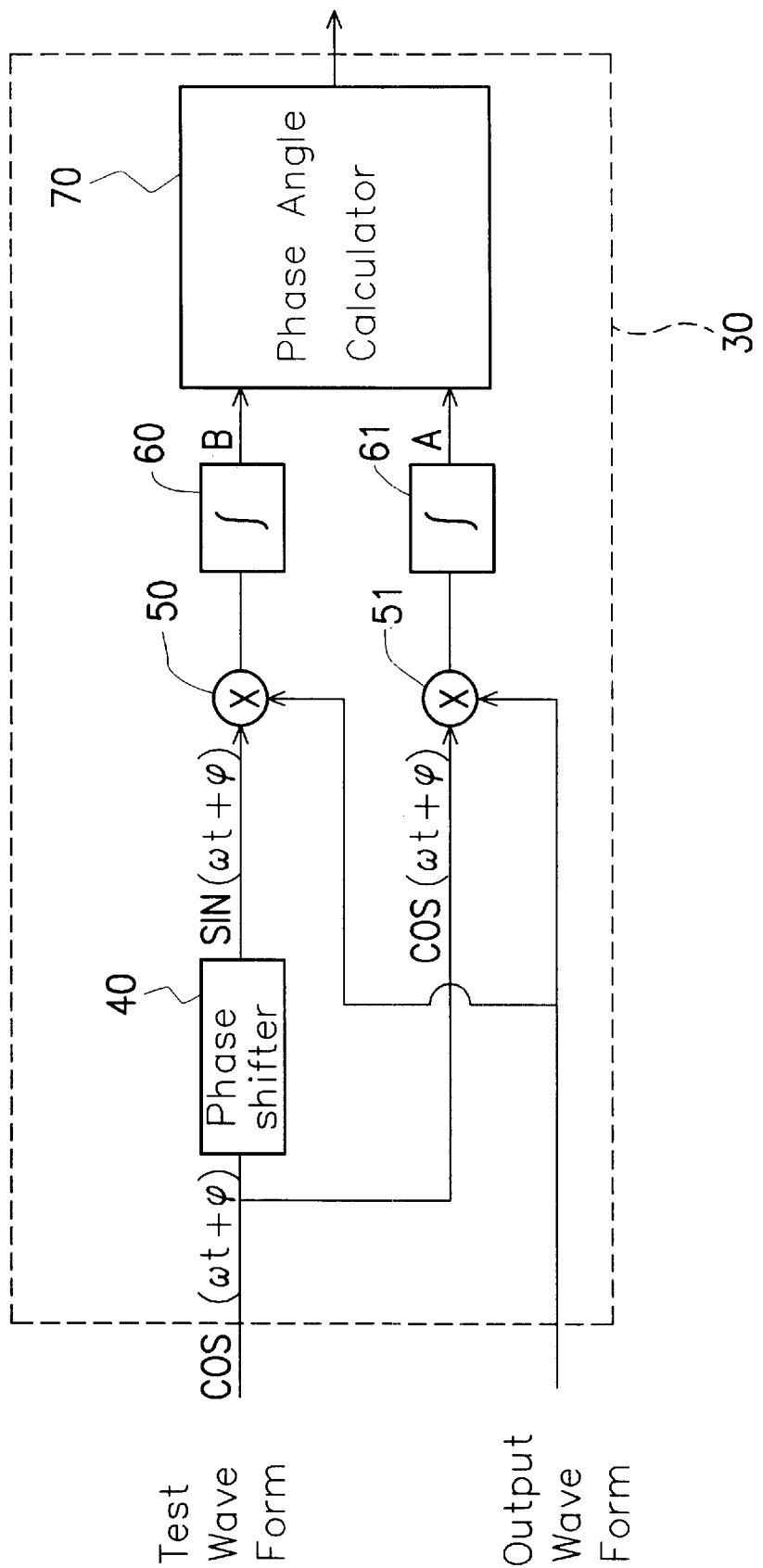
FIG. 3 is a block circuit diagram showing a phase comparator according to the invention.

Referring to FIG. 3, a phase comparator according to the invention is shown. First, a test wave form of $\cos(2\pi \, \text{ft}+\phi)$ with f=1.38 kHz is shifted 90° into a function of $\sin(2\pi \, \text{ft}+\phi)$ by a phase shifter 40. That is, the test wave form of $\cos(2\pi \, \text{ft}+\phi)$ is delayed for a specific time of $$m \times \frac{1}{1.38k} + \frac{1}{4} \times \frac{1}{1.38k}$$

(m is a positive integer) seconds or a specific phase angle of n×360°+90° (n is a positive integer), to become a function of $\sin(2\pi \, \text{ft}+\phi)$ by the phase shifter 40.

Figure 1:
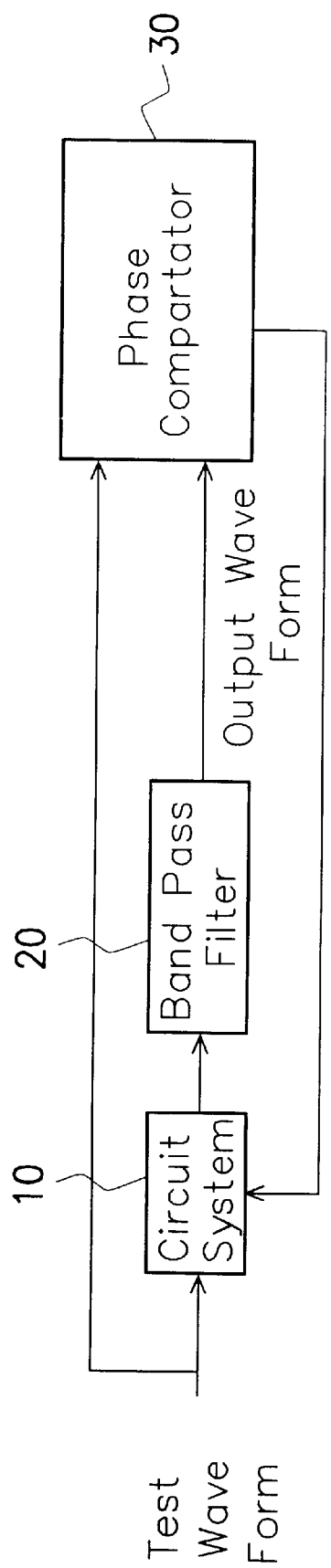
FIG. 1 is a block circuit diagram showing a device for calculating a phase difference according to the prior art.
Figure 2:
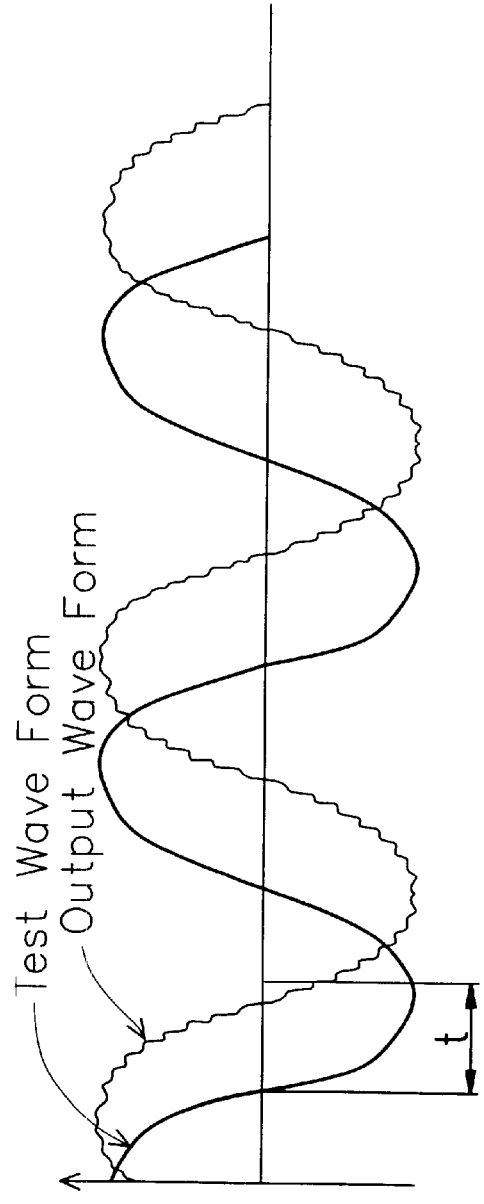
FIG. 2 is a waveform graph showing the phase difference between a test wave form and an output wave form.

Next, the test wave form of $\cos(2\pi t+\phi)$ is multiplied by an output wave form (like that shown in FIG. 1) using a multiplier 51, and then integrated for a complete period by an integrator 61 to generate a first weighted value A. Similarly, the converted function of $\sin(2\pi t+\phi)$ is multiplied by the output wave form using a multiplier 50, and then integrated for a complete period by an integrator 60 to generate a second weighted value B. The two values B and A are inputted to a phase angle calculator 70 to generate a value $$\tan^{-1}\frac{B}{A}.$$

Therefore, according to formula (1), we know that the value $$\tan^{-1}\frac{B}{A}$$

outputted from the phase angle calculator 70 represents the phase difference between the test wave form and the output wave form.

Furthermore, since noises are random variables which have zero mean after passing through the integrator 60 or 61, consequently, they will not affect the calculated phase difference.

As described above, the phase difference between a test wave form and an output wave form can be calculated using an orthogonal characteristic according to a phase comparator of the invention.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A phase comparator for calculating the phase difference between a test wave form and an output wave form in a disk drive to perform an open loop gain adjustment, comprising:

a phase converter for delaying the test wave form for a specific time based on the frequency thereof, wherein the test wave form is a sinusoidal wave and the output wave form is orthogonal to the test wave form;

a first multiplier electrically coupled to the phase converter for performing a first operation by multiplying the delayed test wave form with the output wave form;

a first integrator electrically coupled to the first multiplier for integrating the result of the first operation for a period to generate a first weighted value;

a second multiplier for performing a second operation by multiplying the test wave form with the output wave form;

a second integrator electrically coupled to the second multiplier for integrating the result of the second operation for the same period to generate a second weighted value; and a phase angle calculator electrically coupled to the first integrator and the second integrator for receiving the first weighted value and the second weighted value and then outputting a value representing the phase difference between the test wave form and the output wave form based on a ratio of the first weighted value to the second weighted value, wherein the open loop gain adjustment forces the disk drive to have a consistent system bandwidth.

2. The phase comparator as claimed in claim 1, wherein the period is the period of the test wave form.

3. The phase comparator as claimed in claim 1, wherein the test wave form is a sine wave form.

4. The phase comparator as claimed in claim 1, wherein the test wave form is a cosine wave form.

5. The phase comparator as claimed in claim 1, wherein the specific time is one quarter of the period of the test wave form.

6. The phase comparator as claimed in claim 1, wherein the specific time is (¼+m) times the period of the test wave form, wherein the m is a positive integer.

7. The phase comparator as claimed in claim 1, wherein the value representing the phase difference is $\tan^{-1}$ (the first weighted value/the second weighted value).

8. A method for calculating the phase difference between a test wave form and an output wave form to perform an open loop gain adjustment, comprising the following steps:

delaying the test wave form for a specific time, wherein the test wave form is a sinusoidal wave and the output wave form is orthogonal to the test wave form;

performing a first operation by multiplying the output wave form with the delayed test wave form;

integrating the result of the first operation for a period to generate a first weighted value;

performing a second operation by multiplying the output wave form with the test wave form;

integrating the result of the second operation for the same period to generate a second weighted value; and calculating the phase difference between the test wave form and the output wave form based on a ratio of the first weighted value to the second weighted value, wherein the open loop gain adjustment forces the disk drive to have a consistent system bandwidth.

9. The method as claimed in claim 8, wherein the phase difference is a value of $\tan^{-1}$ (the first weighted value/the second weighted value).

10. The method as claimed in claim 8, wherein the period is the period of the test wave form.

11. The method as claimed in claim 8, wherein the test wave form is a cosine wave form.

12. The method as claimed in claim 8, wherein the specific time is ¼ of the period of the test wave form.

13. The method as claimed in claim 8, wherein the specific time is (¼+m) times the period of the test wave form, wherein the m is a positive integer.

* * * * *